United States Patent [19]

Ogawa

[11] Patent Number: 4,742,264

[45] Date of Patent: May 3, 1988

[54] PIEZOELECTRIC SOUND GENERATOR

[75] Inventor: Toshio Ogawa, Nagaokakyo, Japan

[73] Assignee: Murata Manufacturing Co., Ltd.

[21] Appl. No.: 47,588

[22] Filed: May 6, 1987

Related U.S. Application Data

[63] Continuation of Ser. No. 824,160, Jan. 30, 1986, abandoned.

[30] Foreign Application Priority Data

Mar. 8, 1985 [JP] Japan ................................ 60-46897

[51] Int. Cl.[4] ........................................ H01L 41/08

[52] U.S. Cl. ................................ 310/332; 310/359; 310/366

[58] Field of Search ............... 310/328, 332, 366, 358, 310/359

[56] References Cited

U.S. PATENT DOCUMENTS 3,390,287 6/1968 Sonderegger ...................... 310/334

3,458,915 8/1969 Miller et al. ...................... 310/359

3,489,931 1/1970 Teaford ...................... 310/328 X 3,590,287 6/1971 Berlincourt et al. ............... 310/359

4,087,716 5/1978 Heywang ...................... 310/359 X 4,471,256 9/1984 Igashira et al. ................... 310/328

4,475,014 10/1984 King ............................ 310/332 X 4,523,121 6/1985 Takahashi et al. ................. 310/334

4,564,782 1/1986 Ogawa ............................ 310/359

4,570,098 2/1986 Tomita et al. .................... 310/323 X 4,633,120 12/1986 Sato et al. ...................... 310/359 X

*Primary Examiner*—Mark O. Budd

*Attorney, Agent, or Firm*—Ostrolenk, Faber, Gerb & Soffen

[57] ABSTRACT

A piezoelectric sound generator which comprises a monolithic sintered body obtained by laminating a plurality of ceramic green sheets formed alternately with a plurality of electrodes and cofiring the same. Electrical connections between the electrodes in the sintered body are provided within through-holes formed at the vibrational node of the piezoelectric sound generator.

9 Claims, 6 Drawing Sheets

PIEZOELECTRIC SOUND GENERATOR

This is a continuation of Application Ser. No. 824,160 now abandoned filed on Jan. 30, 1986.

BACKGROUND OF THE INVENTION

1. Field of the Invention

The present invention relates to a piezoelectric sound generator which is applied to, e.g., a piezoelectric buzzer or a piezoelectric loudspeaker, and more particularly, it relates to a piezoelectric sound generator including a monolithic sintered body which is obtained by laminating a plurality of ceramic green sheets and electrodes and cofiring the same.

2. Description of the Prior Art

FIG. 2 is a schematic sectional view showing a conventional piezoelectric buzzer as an example of a conventional piezoelectric sound generator. Referring to FIG. 2, a laminated type vibrator 2 is adhered to a metal plate 1. The vibrator 2 is formed by laminating three piezoelectric ceramic plates 2*a*, 2*b* and 2*c* so as to reduce its impedance and increase its sound pressure.

In the piezoelectric buzzer as shown in FIG. 2, the piezoelectric ceramic plates 2*a* to 2*c* are previously fired separately and polarized in directions indicated by arrows in FIG. 2, to be integrally formed with electrodes 3*a* to 3*d* on the metal plate 1. The electrodes 3*a* and 3*c* are electrically interconnected with each other by an electric connecting part 4*a* formed on the outer peripheral portion while the electrodes 3*b* and 3*d* are electrically interconnected with each other by an electric connecting part 4*b* also formed on the outer peripheral portion. In the piezoelectric buzzer as shown in FIG. 2, the vibrator 2 is formed by the three ceramic plates 2*a* to 2*c*, and is capable of generating high sound pressure because of its reduce impedance.

Another prior device, disclosed in, Japanese Patent Application No. 226577/1984 in the name of the assignee of the present application, is a piezoelectric buzzer which is in the background of the present invention, although this related art has not yet been published. FIG. 3 shows the piezoelectric buzzer as disclosed in the Japanese Patent Application No. 226577/1984. Referring to FIG. 3, a monolithic ceramic vibrator 12 is adhered on a vibration plate 11 which comprises a metal or plastic plate. The ceramic vibrator 12 has three ceramic layers 12*a* to 12*c*, which are obtained by laminating three ceramic green sheets, alternating with layers of electrode paste adapted to form inner electrodes 13*b* and 13*c*, and cofiring the same. Electrodes 13*a* and 13*d* are formed simultaneously with the inner electrodes 13*b* and 13*c* or separately after the firing. The ceramic layers 12*a* to 12*c* are polarized in directions indicated by arrows in FIG. 3. The electrodes 13*a* and 13*c* are interconnected with each other by an electrode connecting part 14*a* formed on the outer periphery of the monolithic ceramic vibrator 12 while the electrodes 13*b* and 13*d* are interconnected with each other by an electrode connecting part 14*b* formed on the outer periphery of the monolithic ceramic vibrator 12. Thus, in the piezoelectric buzzer as shown in FIG. 3, the monolithic ceramic vibrator 12 is integrally formed, whereby the respective ceramic layers 12*a* to 12*c* can be made very thin. Hence the impedance of the vibrator 12 is reduced in comparison with that of the piezoelectric buzzer as shown in FIG. 2, and remarkably higher sound pressure can be obtained.

FIG. 4 is a side elevational view schematically showing vibration states of the conventional piezoelectric buzzer as shown in FIGS. 2 or 3. In the conventional piezoelectric buzzer, a ceramic vibrator 22 adhered to a vibration plate 21 vibrates upon application of a voltage so as to alternate between two bent states as shown in broken lines A and B in FIG. 4, thereby generating sound waves. The modes X of such vibration are inside the outer periphery of the ceramic vibrator 22 as shown in FIG. 4, whereby the outer peripheral portions of the ceramic vibrator 22 are displaced a considerable distance by the vibration.

On the other hand, the electric connecting parts 4*a*, 4*b*, 14*a* and 14*b* of the conventional laminated type piezoelectric buzzers are formed on the outer peripheral portions of the ceramic vibrators. Thus, the electric connecting parts 4*a*, 4*b* tend to 14*a* and 14*b* suppress the vibration of the ceramic vibrators, and as a result, it has not yet been possible to obtain the desired sound pressure at certain desired resonance frequencies. Such problems are not restricted to the piezoelectric buzzers as shown in FIGS. 2 and 3 employing the so-called laminated or unimorph type vibrators, but also exist in a piezoelectric buzzer employing a bimorph type and other related types of vibrator.

SUMMARY OF THE INVENTION

Accordingly, an object of the present invention is to overcome the aforementioned problem and provide a sound generator whose vibration is not suppressed by electric connecting parts, thereby to reliably obtain desired sound pressure.

The present invention provides a piezoelectric sound generator employing a monolithic sintered body which is obtained by laminating a plurality of ceramic green sheets and a plurality of electrodes and cofiring the same, wherein at least one electric connecting part for connecting the electrodes with each other is formed in a through-hole provided in a position which does not restrict vibration.

The position not restricting the vibration is generally located atanode or in the vicinity of a node.

The piezoelectric sound generator according to the present invention is applicable to both unimorph and bimorph type vibrators.

When the unimorph type vibrator is employed, the ceramic layers are polarized in alternating directions along the direction of thickness. In this case, alternate electrodes are electrically interconnected with each other by electric connecting parts.

In the case of the bimorph type vibrator there are, provided first and second vibrating regions which vibrate in respective directions opposite to each other and are sequentially arranged along the direction of thickness. When an odd number of ceramic layers are provided, the central ceramic layer is not polarized, the first and second vibrating regions being arranged on both sides of the non-polarized ceramic layer, and the ceramic layers forming the first and second vibrating regions being polarized symmetrically about the non-polarized ceramic layer. Also in this case, alternate electrodes are electrically connected with each other by electric connecting parts.

On the other hand, when an even number of ceramic layers are provided, the respective ceramic layers in the first and second vibrating regions are polarized in directions opposite to each other. In this case, the respective ceramic layers in the first and second vibrating regions, which layers are positioned adjacent to each other, are polarized in the same direction along the direction of thickness. Also in this case, alternate respective electrodes in each region are electrically interconnected with each other by electric connecting parts.

According to the present invention, at least one electric connecting part is formed in a through-hole which is provided in a position not restricting vibration, whereby the through-hole portion is not substantially moved upon vibration and will not suppress the vibration, and hence sound waves can be reliably obtained having a desired sound pressure at a desired resonant frequency.

In addition to the piezoelectric buzzer, the present invention is applicable to a piezoelectric loudspeaker such as a tweeter and other general piezoelectric sound generators.

These and other objects, features, aspects and advantages of the present invention will become more apparent from the following detailed description of preferred embodiments of the present invention when taken in conjunction with the accompanying drawings.

DESCRIPTION OF THE PREFERRED EMBODIMENTS

Preferred embodiments of the present invention will now be described, with reference to the accompanying drawings.

Figure 1:
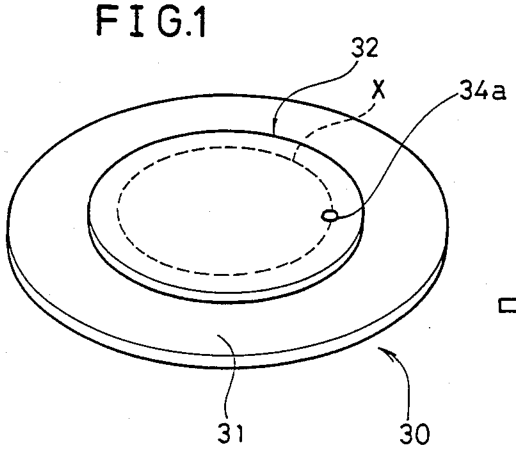
FIG. 1 is a perspective view schematically illustrating a first embodiment of the present invention.
Figure 4:
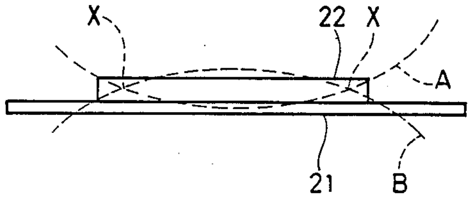
FIG. 4 is a side elevational view showing states of vibration of conventional piezoelectric buzzer as in FIGS. 2 and 3.
Figure 2:
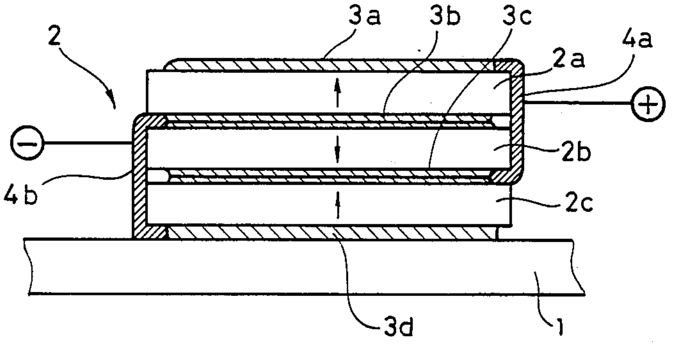
FIG.2 PRIOR ART
FIG. 2 is a partially fragmented sectional view showing an example of a conventional piezoelectric buzzer.
Figure 3:
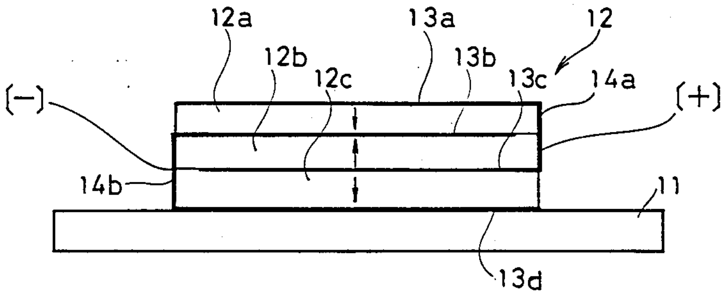
FIG.3 PRIOR ART
FIG. 3 is a side elevational view illustrating an example of a conventional piezoelectric buzzer which is part of the background of the present invention, although the same has not yet been published.

FIG. 1 is a perspective view showing a piezoelectric buzzer 30 according to a first embodiment of the present invention. The piezoelectric buzzer 30 comprises a vibration plate 31 comprising a metal or synthetic resin plate and a monolithic ceramic vibrator 32 adhered to the vibration plate 31. The monolithic ceramic vibrator 32 comprises a sintered body which is obtained by laminating a plurality of ceramic green sheets and a plurality of electrodes and cofiring the same, as hereinafter described in detail. An important feature of the piezoelectric buzzer 30 according to this embodiment resides in that an electric connecting part between the electrodes of the monolithic ceramic vibrator 32 is formed within a through-hole **34*a* which is provided in the vicinity of a vibration node (shown by a broken line X in FIG. 1) of the piezoelectric buzzer 30. Thus, it is understood that the through-hole 34*a* is not substantially moved during vibration of the piezoelectric buzzer 30 and will not suppress the vibration of the piezoelectric buzzer 30**, whereby a desired sound pressure can be obtained.

Following one further details of the structure of the embodiment shown in FIG. 1.

Figure 5:
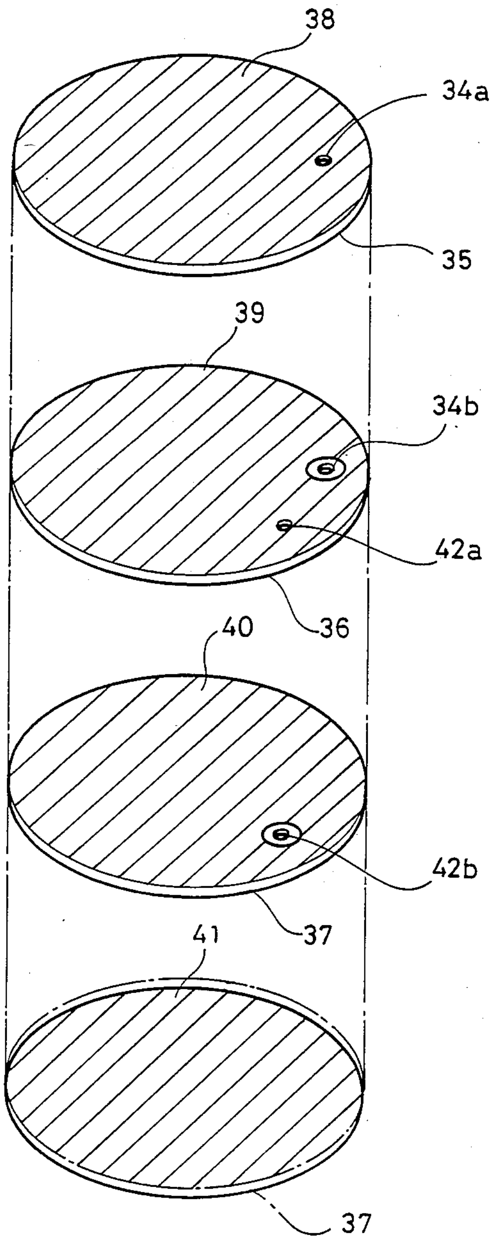
FIG. 5 is a perspective view showing configurations of ceramic green sheets and electrodes which may be employed in the embodiment as shown in FIG. 1.

FIG. 5 is a perspective view illustrating configurations of electrodes in the monolithic ceramic vibrator 32. As shown in FIG. 5, conductive paste layers 38, 39, 40 and 41 of platinum, palladium or silver-palladium are coated on ceramic green sheets 35, 36 and 37. Although the conductive paste layer 41 is formed on the back surface of the ceramic green sheet 37, i.e., the surface opposite to the conductive paste layer 40, the same is shown as if it were separated from the sheet 37 in a direction away from the conductive paste layer 40, for easy understanding of this embodiment.

The ceramic green sheet 35 is provided with a through-hole **34*a* which is connected with the conductive paste layer 38 and has a conductive part in its inner wall, which through-hole 34*a* is formed in the vicinity of the vibration node of the vibrator 32. The ceramic green sheet 36 is provided with a through-hole 34*b* in a position aligned with the through-hole 34*a* upon lamination. The through-hole 34*b* is also provided with a conductive part in its inner wall, and the conductive paste layer 39 is removed from the sheet 36 around the periphery of the through-hole 34*b* so that the through hole 34***b* is not connected with the conductive paste layer 39. The through-holes 34*a* and 34*b* are thus adapted to connect the conductive paste layers 38 and 40 with each other.

The ceramic green sheet 36 is provided, in a position separated from the through-hole 34*b* and in the vicinity of the vibration node of the vibration member, with a through-hole 42*a* which is connected with the conductive paste layer 39. Further, the ceramic green sheet 37 is provided with a through-hole 42*b* in a position aligned with the through-hole 42*a* upon lamination. The conductive paste layer 40 is removed around the periphery of the through-hole 42*b* so that the through-hole 42*b* is not connected with the conductive paste layer 40. Thus, the conductive paste layers 39 and 41 are connected with each other by the through-holes 42*a* and 42*b* after lamination.

Figure 6:
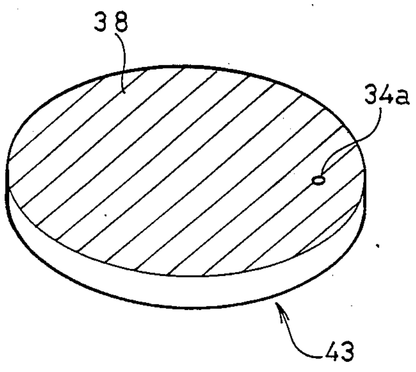
FIG. 6 is a perspective view showing a sintered body obtained by laminating the ceramic green sheets shown in FIG. 5 and cofiring the same.

The aforementioned respective ceramic green sheets 35 to 37 are laminated and cofired, thereby to obtain a sintered body 43 as shown in FIG. 6. In the sintered body 43, the electrodes are electrically interconnected with each other by the through-holes 34*a*, 34*b*, 42*a* and 42*b* as hereinabove described. This arrangement is shown in greater detail in FIG. 7. In cofiring the sintered body 43, the conductive paste layers are baked to serve as electrodes, which electrodes are hereafter described with the same reference numerals as the corresponding conductive paste layers. The electrodes 38 and 41 may be simultaneously formed with the electrodes 39 and 40, or may be separately formed after firing by baking, sputtering, vapor deposition or the like.

Figure 7:
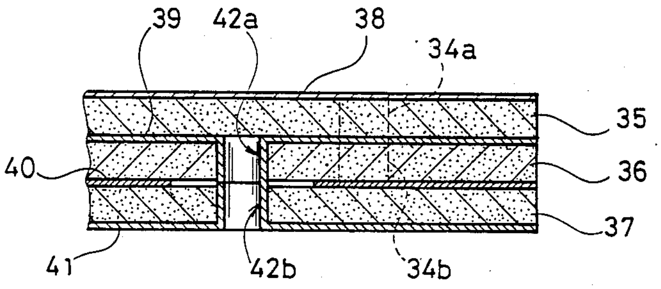
FIG. 7 is a partially fragmented sectional view of the sintered body shown in FIG. 6.

FIG. 7 is a partially fragmented sectional view showing the electrical interconnections provided by the through-holes 42*a* and 42*b*. The through-holes 42*a* and 42*b* are aligned with each other upon lamination. Therefore, the electrode 39, which is electrically connected with the through-hole 42*a*, is electrically connected through the through-holes 42*a* and 42*b* with the electrode 41 which is electrically connected with the through-hole 42*b*.

Figure 8:
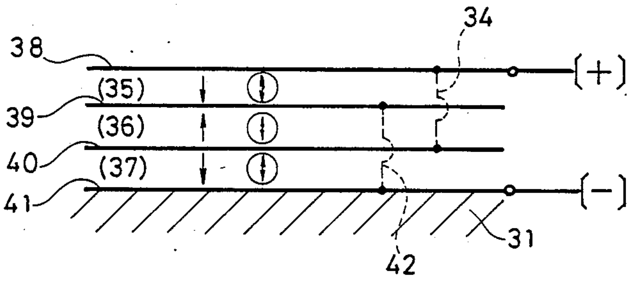
FIG. 8 shows an arrangement of electrical connections for polarizing the embodiment shown in FIG. 1.

FIG. 8 shows an arrangement of electrical connections for polarizing the sintered body obtained in the aforementioned manner. Referring to FIG. 8, numerals 34 and 42 respectively denote electric connecting parts which are formed by the through-holes 34*a* and 34*b*, and 42*a* and 42*b*, in broken lines. Assuming that, in the state shown in FIG. 8, a plus potential is supplied through the electrode 38 and a minus potential is supplied through the electrode 41, the respective ceramic layers 35, 36 and 37 will be polarized in the directions shown by arrows in FIG. 8.

The sintered body 43 polarized in the aforementioned manner is adhered to the vibration plate 31, thereby to obtain the piezoelectric buzzer 30 shown in FIG. 1. In order to drive the piezoelectric buzzer, a plus potential is supplied through the electrode 38 and a minus potential is supplied through the electrode 41 in the same electrical connection arrangement as shown in FIG. 8, whereby the respective ceramic layers 35, 36 and 37 expand as shown by circled bidirectional arrows in FIG. 8, while the ceramic layers 35 to 37 contract when the said potentials are inverted. Thus, the piezoelectric buzzer 30 expands and contracts similarly to a conventional unimorph type ceramic vibrator by alternately switched potentials such as in an AC signal, thereby to vibrate and generate sound waves.

In the embodiment shown in FIG. 1, further, the electric connecting parts formed by the through-holes 34*a*, 34*b*, 42*a* and 42*b* are provided in the vicinity of the vibration node. In other words, the electric connecting parts 34 and 42 are formed in positions that are scarcely displaced by vibration of the piezoelectric buzzer 30, and hence the electric connecting parts will not restrict the vibration. Thus, desired sound pressure can be obtained.

Figure 9:
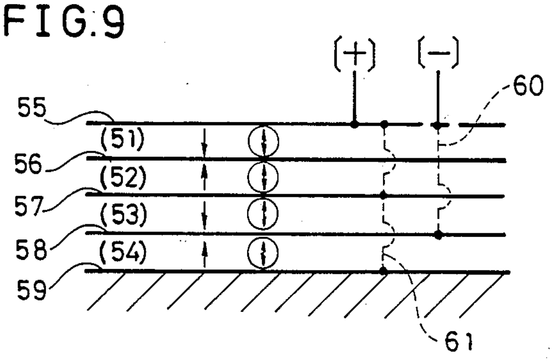
FIG. 9 shows electrical connections for driving a second embodiment of the present invention.

FIG. 9 shows an arrangement of electrical connections for a second embodiment of the present invention. The second embodiment also relates to a unimorph type vibrator, in which an even number of ceramic layers are formed, as opposed to an odd number in the first embodiment. In the second embodiment, four ceramic layers 51 to 54 are laminated between respective pairs of electrodes 55 to 59, and adjacent ones of the respective ceramic layers 51 to 54 are polarized in opposite directions. The electrodes 55 to 59 are electrically connected with each other in an alternate manner by electric connecting parts 60 and 61, which are formed within respective through-holes. Thus, after the ceramic layers 51 to 54 are polarized in the directions shown by arrows in FIG. 9, a plus potential is supplied through the electrode 55 and minus potentials are supplied through the electrodes 56 and 58, which are connected with each other by the through-hole 60, whereby the respective ceramic layers 51 to 54 expand as shown by circled bidirectional arrows in FIG. 9 and contract upon inversion of the potentials, whereby the piezoelectric buzzer 30 can generate sound waves similarly to the embodiment as shown in FIG. 1.

Figure 10:
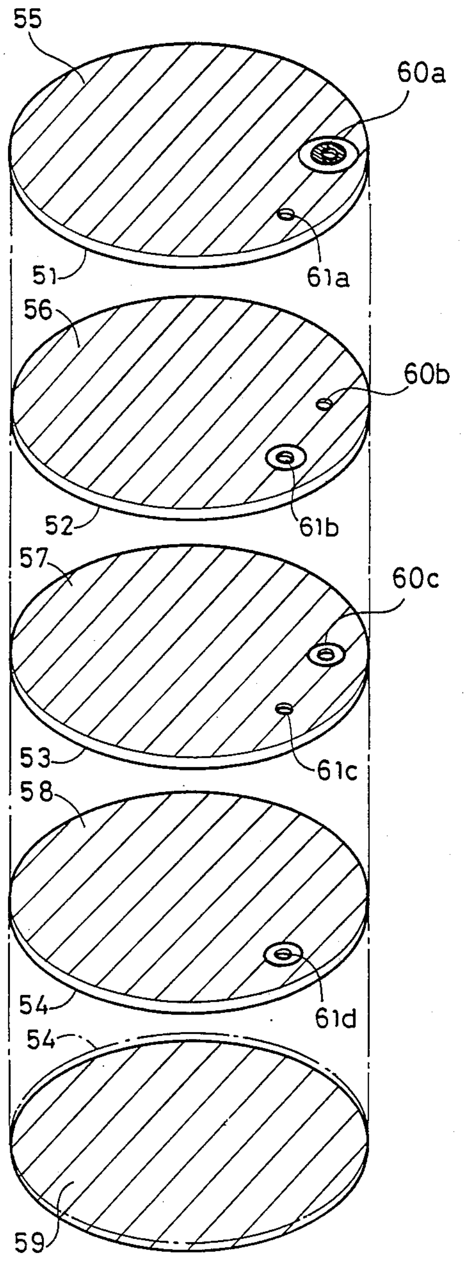
FIG. 10 is a perspective view showing configurations of ceramic green sheets and electrodes which may be employed in the second embodiment of the present invention.

The structure of the embodiment shown in FIG. 9 will now be described with reference to FIGS. 10 and 11. First, as shown in FIG. 10, ceramic green sheets 51 to 54 (the ceramic green sheets are indicated by reference numerals identical to those of the corresponding ceramic layers in FIG. 9) for forming the ceramic layers 51 to 54 are prepared and provided with conductive paste layers 55 to 59 as shown in FIG. 10. Although the conductive paste layer 59 is formed on the back surface of the ceramic green sheet 54, i.e., on the surface opposite to the conductive paste layer 58, the same is shown as if it were separate from the green sheet 54, for easy understanding of this embodiment.

Referring to FIG. 10, the ceramic green sheet 51 is provided with through-holes 60*a* and 61*a* at locations in the vicinity of the vibration node of the vibration member obtained. The conductive paste layer 55 is partially removed from a portion around the periphery of the through-hole 60*a* so that the through-hole 60*a* is not connected with the conductive paste layer 55. On the other hand, the through-hole 61*a* is connected with the conductive paste layer 55. In a similar manner, through-holes 60*b* and 60*c* and through-holes 61*b*, 61*c* and 61*d* are formed in the ceramic green sheets 52, 53 and 54. The through-hole 60*a* is formed so as to be aligned with the through-holes 60*b* and 60*c* while the through-hole 61*a* is formed to be aligned with the through-holes 61*b*, 61*c* and 61*d* upon lamination of the ceramic green sheets 51 to 54. Around the periphery of the through-hole 60*a*, a conductive part having an appropriate surface area may be formed on the ceramic green sheet 51 for connecting the piezoelectric buzzer 30 with an external device such as an AC signal source.

Figure 11:
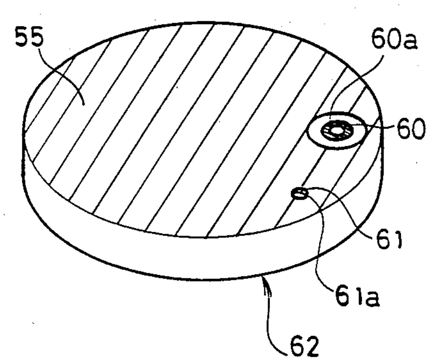
FIG. 11 is a perspective view showing a sintered body obtained by laminating the ceramic green sheets shown in FIG. 10 and cofiring the same.

The ceramic green sheets 51 to 54 as shown in FIG. 10 are laminated and cofired thereby to obtain a sintered body 62 as shown in FIG. 11. The conductive paste layers 55 to 59 are baked at the same time the sintered body 62 is obtained to serve as electrodes, which are hereafter described with the same reference numerals as the corresponding conductive paste layers. The electrodes 55 and 59 and the electric connecting part 60 may be formed simultaneously with or separately from the electrodes 56 to 58 by baking, sputtering, vapor deposition or the like. The sintered body 62 is provided with the electric connecting part 60 formed by the through-holes 60*a*, 60*b* and 60*c* and the electric connecting part 61 formed by the through-holes 61*a*, 61*b*, 61*c* and 61*d*, to obtain the electrical connection arrangement shown in FIG. 9. Thus, after polarization in the directions shown by arrows in the state of electric connection as shown in FIG. 9, a plus potential is supplied through the electrode 55 and a minus potential is supplied through the through-hole 60*a*, which is electrically connected with the electrodes 56 and 58, whereby adjacent ones of the respective ceramic layers 51 to 54 are polarized in opposite directions. Then, in a similar manner to the embodiment as shown in FIG. 1, the sintered body 60 is adhered to a vibration plate to be applied with driving voltage through the electrode 55 and the through-hole 60*a*, thereby to form a piezoelectric buzzer. For example, when a plus potential is applied through the electrode 55 and a minus potential is applied through the through-hole 60*a*, the respective ceramic layers 51 to 54 expand as shown by circled bidirectional arrows in FIG. 9, while the same contract upon inversion of the potentials. Thus, the potentials are alternately applied to obtain sound waves.

In addition to the aforementioned unimorph type vibrators, the present invention is also applicable to a bimorph type vibrator, and description will now be made of embodiments which relate to such bimorph type vibrators. A bimorph type vibrator includes first and second vibrating regions expanding and contracting in directions reverse to each other, which vibrating regions are provided in the direction of thickness.

Figure 12:
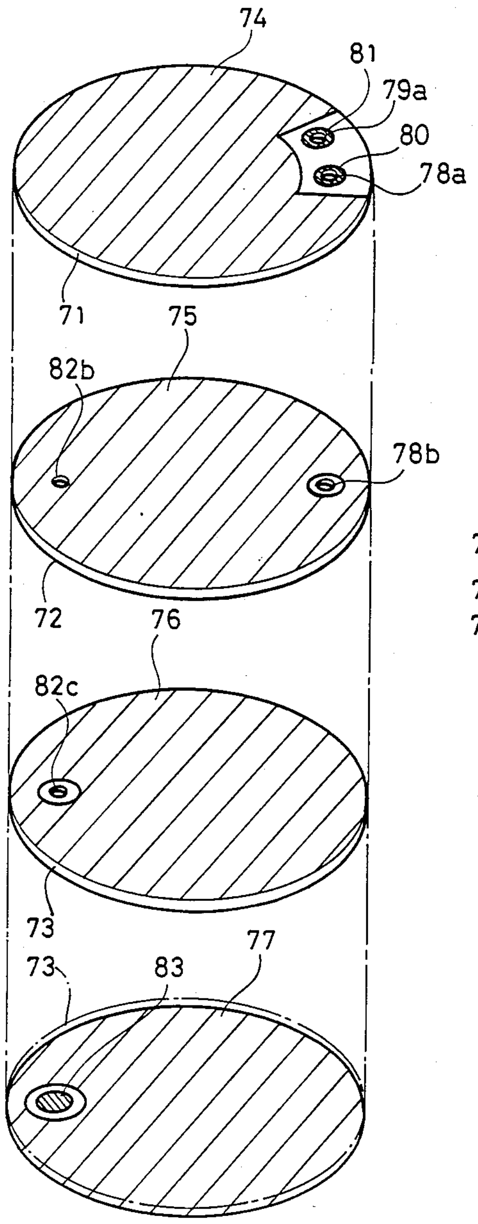
FIG. 12 is a perspective view illustrating configurations of ceramic green sheets and electrodes which may be in a third embodiment of the present invention.

FIG. 12 is a perspective view illustrating configurations of ceramic green sheets and electrodes which are employed in a third embodiment of the present invention. In the third embodiment, an odd number of ceramic green sheets 71, 72 and 73 are prepared and provided with conductive paste layers 74, 75, 76 and 77. The ceramic green sheet 71 is formed with through-holes 78*a* and 79*a* in positions close to a vibration node. The conductive paste layer 74 is removed in portions around the peripheries of the through-holes 78*a* and 79*a* so that the through-holes 78*a* and 79*a* are not electrically connected with the conductive paste layer 74. On the side of the green sheet 71 that has the conductive paste layer, conductive parts 80 and 81 are formed around the peripheries of, the through-holes 78*a* and 79*a*, respectively, and are conductively connected therewith. The conductive parts 80 and 81 are provided to have appropriate surface areas, to be electrically connected with an external device.

The ceramic green sheet 72 is also formed with two through-holes 78*b* and 82*b* in positions close to the vibration node. The through-hole 78*b* is formed in a position aligned with the upwardly positioned through-hole 78*a* upon lamination. On the other hand, the through-hole 82*b* is formed in a position to be in contact with neither the upwardly positioned through-hole 79*a* nor 78*a* upon lamination. The electrode 75 is removed in a portion around the periphery of the through-hole 78*b* so that the through-hole 78*b* is not electrically connected with the electrode 75.

The ceramic green sheet 73 is formed with a through-hole 82*c* similarly to the through-hole 78*b*, which through-hole 82*c* is formed in a position aligned with the upwardly positioned through-hole 82*b*. The through-hole 82*c* is provided on its back surface side, i.e., on the the same side of the green sheet 73 as the electrode 77, with a conductive part 83, which can be connected with the through-holes 82*b* and 82*c* upon lamination. The conductive paste layer 77 is removed in a portion around the conductive part 83 so that the conductive part 83 is not connected with the conductive paste layer 77.

Figure 13:
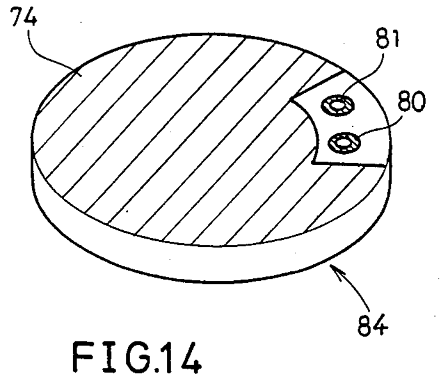
FIG. 13 is a perspective view showing a sintered body obtained by laminating and cofiring the ceramic green sheets shown in FIG. 12.

The respective ceramic green sheets 71 to 73 as shown in FIG. 12 are laminated and cofired thereby to obtain a sintered body 84 as shown in a perspective view in FIG. 13. At the same time the sintered body 84 is obtained, the conductive paste layers 74 to 77 are baked to form electrodes, which electrodes will be hereafter described with the same reference numerals as the corresponding conductive paste layers. The electrodes 74 and 77 and the conductive parts 80, 81 and 83 may be simultaneously formed with the electrodes 75 and 76, or separately formed by baking, sputtering, vapor deposition or the like.

Figure 14:
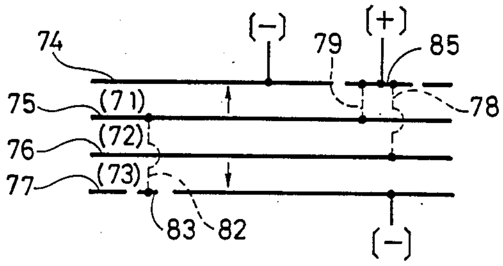
FIG. 14 shows electrical connections for carrying out in polarization of the third embodiment of the present invention.
Figure 15:
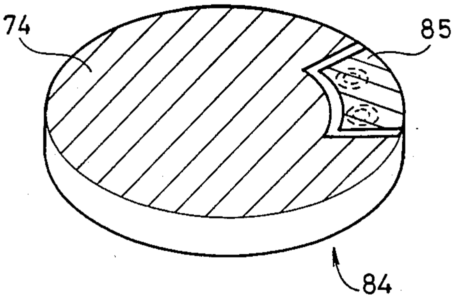
FIG. 15 is a perspective view showing a conductive part for electrical connection formed on the sintered body shown in FIG. 13 and FIG. 14.

In order to electrically connect the conductive parts 80 and 81 formed on the upper surface of the sintered body 84 for polarization, conductive paste, for example, is coated and baked to form a conductive part 85 for connection (see FIG. 15). Thus obtained is the electrical connection arrangement shown in FIG. 14. Namely, the electrodes 75 and 76 are electrically interconnected, via the through-holes 79 and 78, respectively, by the conductive part 85. Therefore, when a plus potential is supplied through the conductive part 85 for connection while minus potentials are supplied through the electrodes 74 and 77, the ceramic layers 71 and 73 are polarized as shown by arrows in FIG. 14 while the ceramic layer 72 is not polarized.

Figure 16:
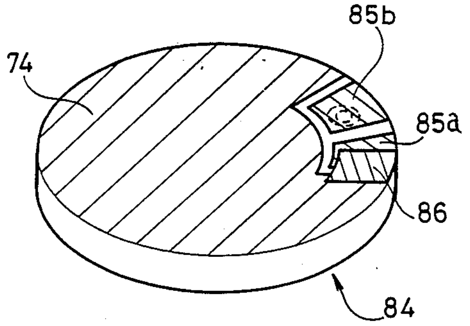
FIG. 16 is a perspective view showing an arrangement for drawing a piezoelectric buzzer according to the third embodiment, which has been obtained through the steps shown in FIGS. 12 to 15.
Figure 17:
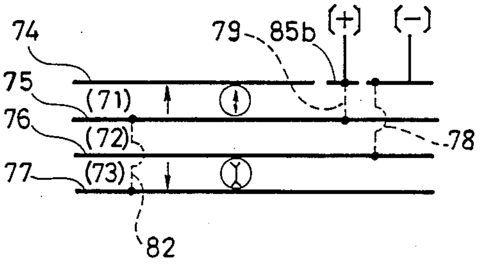
FIG. 17 shows the electrical connections for driving the arrangement shown in FIG. 16.

Then, as shown in a perspective view in FIG. 16, the conductive part 85 is partially removed and thereby divided into conductive parts 85*a* and 85*b*, connection, thereby so as to cut off the electric connection of the through-holes 79 and 78. Further, the divided conductive part 85*a*, which is connected to the through-hole 78, is electrically connected with the electrode 74 by a conductive part 86. Then, the lowermost electrode 77, which is not shown in FIG. 16, is electrically connected with the conductive part 83 by, e.g., coating conductive paste and baking the same. Thus obtained is the electric connection arrangement shown in FIG. 17, in which the ceramic layer 71 serves as a first vibration region and the ceramic layer 73 serves as a second vibration region. Then, a plus potential is supplied through the divided conductive portion 85*b* while a minus potential is supplied through the electrode 74. This causes one of the ceramic layers, for example the first vibration region, to expand, while the other ceramic layer, for example the second vibration region, contracts, as indicated by bidirectional arrows in FIG. 17, which causes the entire bimorph to bend. Thus, the sintered body vibrates by alternate application of the potentials, to be employed as a piezoelectric buzzer.

Also in this embodiment, the electric connecting parts 78, 79 and 82, which are formed by the through-holes, are provided in the vicinity of the vibration node as hereinabove described, whereby the vibration of the piezoelectric buzzer is not restricted.

Figure 18:
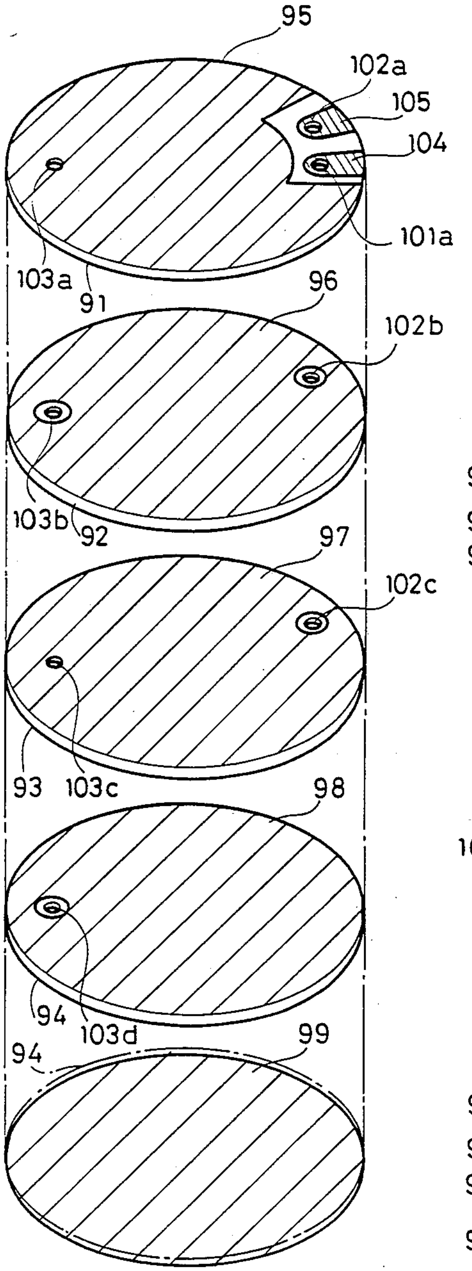
FIG. 18 is a perspective view showing configurations of ceramic green sheets and electrodes which may be employed in a fourth embodiment of the present invention.

FIG. 18 is a perspective view showing configurations of ceramic green sheets and electrodes employed in a piezoelectric buzzer according to a fourth embodiment of the present invention. In the fourth embodiment, an even number of layers of ceramic green sheets 91, 92, 93 and 94 are prepared and provided with conductive paste layers 95 to 99.

The respective ceramic green sheets 91 to 94 have through holes in the vicinity of a vibration node for forming electric connecting parts. More specifically, the ceramic green sheet 91 has through-holes **101*a*, 102*a* and 103*a* formed in the vicinity of the vibration node, while the conductive paste layer 95 is partially removed so that the through-holes 101*a* and 102*a* are not connected with the conductive paste layer 95. On the other hand, the through-hole 103*a* can be connected with the conductive paste layer 95**.

The through-holes **101*a* and 102*a* have connected to the peripheries thereof, conductive parts 104 and 105**, respectively.

In a similar manner, the ceramic green sheets 92 and 93 have through-holes **102*b* and 102*c* formed in positions aligned with the through-hole 102*a* upon lamination, while the respective ceramic green sheets 92 to 94 have through-holes 103*b*, 103*c* and 103*d* formed in positions aligned with the through-hole 103*a*. Within these through-holes 103*b*, 103*c* and 103*d*, however, only the through-hole 103*c* is connected with the electrode 97 positioned on the upper surface of the ceramic green sheet 93 which is provided with the through-hole 103*c***.

Figure 19:
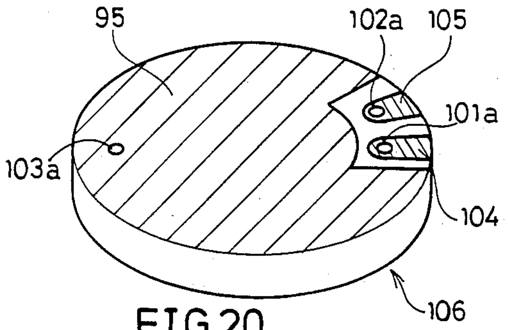
FIG. 19 is a perspective view showing a sintered body obtained by laminating and cofiring the ceramic green sheets shown in FIG. 18.

The respective ceramic green sheets 91 to 94 as shown in FIG. 18 are laminated and cofired, thereby to obtain a sintered body 106 as shown in FIG. 19. The conductive paste layers 95 to 99 are baked at the same time the sintered body 106 is obtained to serve as electrodes, which are hereafter described with the same reference numerals as the conductive paste layers. The electrodes 95 and 99 and the conductive parts 104 and 105 may be simultaneously formed with the electrodes 96 to 98, or may be separately formed by baking, sputtering, vapor deposition or the like after firing.

Figure 20:
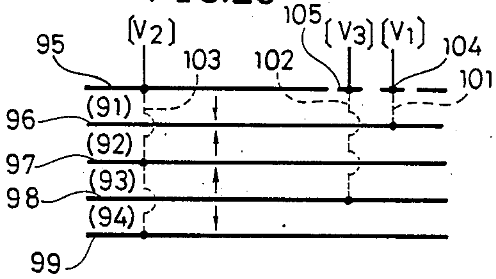
FIG. 20 shows electrical connections for carrying out polarization of the sintered body shown in FIG. 19.

FIG. 20 shows the electrical connections for polarizing the sintered body 106. As shown in from FIG. 20, the conductive part 104 and the electrode 96 are electrically connected with each other by an electric connecting part 101 which is formed in the through-hole **101*a*, while the conductive part 105 is electrically connected with the electrode 98 by an electric connecting part 102 which is formed in the through-holes 102*a* to 102*c*. Similarly, the electrode 95 is electrically connected with the electrodes 97 and 99 by an electric connecting part 103 which is formed in the through-holes 103*a* to 103*d*. In this arrangement, when voltages $V_1$, $V_2$ and $V_3$ having the relation $V_2-V_1=V_3-V_2$ are respectively applied through the conductive part 104, the electrode 95 and the conductive part 105, the respective ceramic layers 91 to 94 are polarized in directions indicated by arrows in FIG. 20**.

Figure 21:
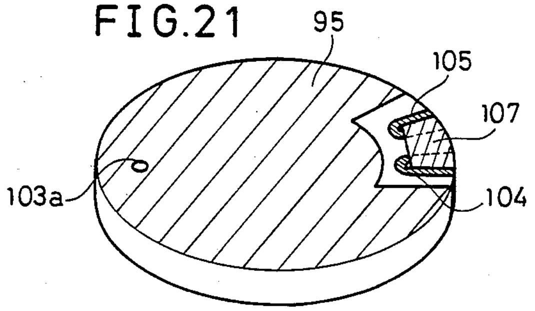
FIG. 21 is a perspective view of an arrangement for driving the fourth embodiment obtained by polarizing the sintered body as shown in FIG. 19 and FIG. 20.
Figure 22:
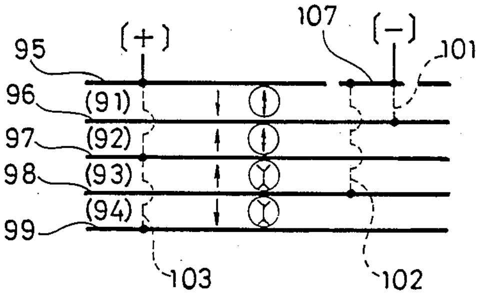
FIG. 22 shows electrical connections for driving the embodiment shown in FIG. 21.

Then, as shown in a perspective view in FIG. 21, a conductive part 107 is formed to electrically connect the conductive part 104 with the conductive part 105. FIG. 22 shows the electrical connections completed in the aforementioned manner. In order to drive the sintered body 106, a plus potential may be applied through the electrode 95 and a minus potential may be applied through the conductive part 107 for connection as shown in FIG. 22, whereby the ceramic layers 91 and 92 serving as a first vibrating region expand in the direction of thickness while the ceramic layers 93 and 94 serving as a second vibrating region contract in the direction of thickness as indicated by circled bidirectional arrows in FIG. 22, and hence the sintered body 106 is downwardly bent as a whole. The plus and minus potentials may be alternately applied to the electrode 95 and the conductive part 107 so as to obtain sound pressure similarly to the piezoelectric buzzers according to the embodiments hereinabove described. Also in this embodiment, the electric connecting parts 101, 102 and 103 for connecting the respective electrodes are provided in the vicinity of the vibration node as hereinabove described, whereby the vibration of the sintered body 106 is not restricted and sound waves can be obtained at desired sound pressure and at a desired frequency.

Although embodiments of the present invention have been described and illustrated in detail, it is clearly understood that the same is by way of illustration and example only and is not to be taken by way of limitation, the spirit and scope of the present invention being limited only by the terms of the appended claims.

What is claimed is:

1. An intermediate product for use in manufacturing a bimorph type piezoelectric sound generator, said product comprising:

(a) a laminated and cofired monolithic sintered body comprising an odd plurality of piezoelectric ceramic layers alternating with a plurality of inner electrodes, said body also having first and second outer electrodes;

(b) said body having at least three electrical connectors formed in respective through-holes, each said through-hole extending through at least one said layer and interconnecting electrodes on opposite sides of said layer, each said through-hole being provided in the vicinity of a vibrational node of said body;

(c) said electrical connectors being selectively interconnectable with each other and with said outer electrodes to provide at least first and second successive connection arrangements;

(d) said first connection arrangement providing terminals for receiving respective predetermined high and low potentials, so as to polarize said odd plurality of said ceramic layers with at least one central ceramic layer in said body remaining non-polarized, and with respective other said ceramic layers forming first and second vibrating regions on respective sides of said non-polarized ceramic layer, corresponding ones of said layers in said first and second vibrating regions being polarized in opposite directions symmetrically about said non-polarized ceramic layer; and (e) said second connection arrangement providing terminals for receiving respective predetermined high and low potentials, after said layers are polarized as aforesaid, for causing said layers in one of said first and second vibrating regions to expand and causing said layers in the other of said first and second vibrating regions to contract.

2. An intermediate product for use in manufacturing a bimorph type piezoelectric sound generator, said product comprising:

(a) a laminated and cofired monolithic sintered body comprising an even plurality of piezoelectric ceramic layers alternating with a plurality of inner electrodes, said body also having first and second outer electrodes;

(b) said body having at least three electrical connectors formed in respective through-holes, each said through-hole extending through at least one said layer and interconnecting electrodes on opposite sides of said layer, each said through-hole being provided in the vicinity of a vibrational node of said body;

(c) said electrical connectors being selectively interconnectable with each other and with said outer electrodes to provide at least first and second successive connection arrangements;

(d) said first connection arrangement providing respective terminals for receiving three predetermined unequal potentials, so as to polarize said even plurality of said ceramic layers symmetrically about a central electrode of said body to form first and second vibrating regions, with respective pairs of said ceramic layers located symmetrically about said central electrode in said first and second vibrating regions being polarized in the same direction, and each pair of said ceramic layers positioned adjacent to each other in both said first and second vibrating regions being polarized in opposite directions along the direction of thickness; and (e) said second connection arrangement providing terminals for receiving respective predetermined high and low potentials, after said layers are polarized as aforesaid, for causing said layers in one of said first and second vibrating regions to expand and causing said layers in the other of said first and second vibrating regions to contract.

3. A product as in claim 1, wherein (a) said monolithic sintered body comprises three piezoelectric ceramic layers obtained by laminating and cofiring first, second, and third piezoelectric ceramic green sheets alternating with first and second inner electrodes, said first and second inner electrodes being relatively near said first and second outer electrodes, respectively;

(b) in said first connection arrangement:

said first and second inner electrodes are connected to each other and to a terminal for receiving such high potential, and said first and second outer electrodes provide terminals for receiving such low potential; and (c) in said second connection arrangement:

said first inner electrode and said second outer electrode are connected to each other and to a terminal for receiving such high potential, and said second inner electrode is connected to said first outer electrode which provides a terminal for receiving such low potential.

4. A product as in claim 3, wherein such high and low potentials received in said second connection arrangement cause said first vibrating region to expand and said second vibrating region to contract.

5. A product as in claim 3, wherein said first and second inner electrodes are connected by respective through-hole connectors to first and second access points adjacent to said first outer electrode, and said first inner electrode is connected by a respective through-hole connector to a third access point adjacent to said second outer electrode, said first and second access points being disposed for being interconnected to form said first connection arrangement; and said second access point being disposed for being connected to said first outer electrode, and said third access point being disposed for being connected to said second outer electrode, to form said second connection arrangement.

6. A product as in claim 5, further comprising a first jumper for interconnecting said first and second access points in said first connection arrangement; and a second jumper for interconnecting said second access point to said first outer electrode, and a third jumper for interconnecting said third access point to said second outer electrode, in said second connection arrangement.

7. A product as in claim 2, wherein (a) said monolithic sintered body comprises four piezoelectric ceramic layers obtained by laminating and cofiring first, second, third and fourth piezoelectric ceramic green sheets alternating with first, second, and third inner electrodes, said first and third inner electrodes being relatively near said first and second outer electrodes, respectively;

(b) in said first connection arrangement:

said first inner electrode is connected by a through-hole connector to a first terminal for receiving a first potential $V_1$, said second inner electrode is connected by through-hole connectors to both said first and second outer electrodes, the latter providing a second terminal for receiving a second potential $V_2$, and said third inner electrode is connected by a through-hole connector to a third terminal adjacent to the first terminal, for receiving a third potential $V_3$, wherein $V_3$ is greater than $V_2$, and $V_2$ is greater than $V_1$; and (c) in said second connection arrangement:

said first and third terminals are connected together for receiving such low potential, and said second terminal is for receiving such high potential.

8. A product as in claim 7, wherein $V_3 - V_2 = V_2 - V_1$.

9. A product as in claim 7, wherein such high and low potentials received in said second connection arrangement cause said first vibrating region to expand and said second vibrating region to contract.

* * * * *